United States Patent
Yang (10) Patent No.: US 7,751,273 B2
(45) Date of Patent: Jul. 6, 2010

(54) LAYOUT STRUCTURE OF SUB-WORLD LINE DRIVER AND FORMING METHOD THEREOF

(75) Inventor: Hyang-Ja Yang, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 235 days.

(21) Appl. No.: 12/115,422

(22) Filed: May 5, 2008

(65) Prior Publication Data

US 2008/0278987 A1    Nov. 13, 2008

(30) Foreign Application Priority Data

May 7, 2007    (KR) .................... 10-2007-0044206

(51) Int. Cl.
*G11C 8/00* (2006.01)
(52) U.S. Cl. .................. 365/230.06; 365/51; 257/202; 257/206; 257/210
(58) Field of Classification Search ........................ None
See application file for complete search history.

(56) References Cited

U.S. PATENT DOCUMENTS

2006/0163613 A1* 7/2006 Chang et al. ................ 257/202
2008/0112253 A1* 5/2008 Youn et al. ............. 365/230.06

FOREIGN PATENT DOCUMENTS

| KR | 2000-0067102 | 11/2000 |
| KR | 2006-0085567 | 7/2006 |
| KR | 2006-0131334 | 12/2006 |

OTHER PUBLICATIONS

English language abstract of Korean Publication No. 2000-0067102.
English language abstract of Korean Publication No. 2006-0085567.
English language abstract of Korean Publication No. 2006-0131334.

* cited by examiner

*Primary Examiner*—Hoai V Ho
*Assistant Examiner*—James G Norman
(74) *Attorney, Agent, or Firm*—Muir Patent Consulting, PLLC (57) ABSTRACT

A layout structure of a Sub-Word Line Driver (SWD) and a forming method thereof. A layout structure of an SWD may include first through fourth metal-oxide-semiconductor (MOS) transistors. The layout structure may include a first area including an active area of the first MOS transistor, wherein a gate-poly (GP) of the first MOS transistor may be disposed in a predefined direction over a portion of the first area. The layout structure may also include a second area including an active area of the second through fourth MOS transistors. Each GP of the second through fourth MOS transistors may be disposed in parallel to each other. The GP of the first MOS transistor disposed in the predefined direction may be substantially perpendicular to each GP of the second through fourth MOS transistors. The layout structure of an SWD can improve a driving capability without increasing an area of the chip.

20 Claims, 9 Drawing Sheets

LAYOUT STRUCTURE OF SUB-WORLD LINE DRIVER AND FORMING METHOD THEREOF

CROSS-REFERENCE TO RELATED PATENT APPLICATION

This application claims the benefit of Korean Patent Application No. 10-2007-0044206 filed on May 7, 2007, in the Korean Intellectual Property Office, the disclosure of which is incorporated herein in its entirety by reference.

BACKGROUND OF THE INVENTION

1. Field of the Invention

The present invention relates to a layout structure of a Sub-Word Line Driver (SWD) and a forming method thereof, and more particularly, to a layout structure of a SWD and a forming method thereof, which improve driving capabilities without expanding the area of a chip.

2. Description of the Related Art

The biggest market in the semiconductor industry is the Dynamic Random Access Memory (DRAM) market. The DRAM has been continuously developed as a main memory and advances have been made in terms of high density, low power, and low cost.

The cost competitiveness is rapidly leveling off and semiconductor producers are focusing more on increasing productivity per wafer. The number of chips produced per wafer can be increased when a cell size and a core area are reduced, thereby increasing the productivity. The core area exponentially increases with higher density and higher performance of a product. Thus, it is important to reduce the core area in a DRAM memory device.

There is a Sub-Word line Driver (SWD) area in the core area of a semiconductor device used to amplify a Word Line (WL) to a high supply voltage Vpp. As a reference, the SWD is a circuit switching on/off the word line during operations of reading/writing data of a cell. The SWD is located in the core of the semiconductor device. Thus, reduction and expansion of the SWD area is closely related to reduction and expansion of an entire chip area.

SUMMARY OF THE INVENTION

The present invention provides a layout structure of a Sub-Word line Driver (SWD) which can improve a driving capability without expanding the area of a chip.

The present invention also provides a method of forming an SWD which can improve a driving capability without expanding the area of a chip.

According to an aspect of the present invention, there is provided a layout structure of the SWD, which may comprise: first through fourth metal-oxide-semiconductor (MOS) transistors, a first area including an active area of the first MOS transistor, wherein a gate-poly (GP) of the first MOS transistor is disposed in a predefined direction over a portion of the first area; and a second area including an active area of the second through fourth MOS transistors, wherein each GP of the second through fourth MOS transistors is disposed over different portions of the second area, each GP of the second through fourth MOS transistors being disposed in parallel to each other, the second area being substantially adjacent to the first area, wherein the GP of the first MOS transistor disposed in the predefined direction is substantially perpendicular to each GP of the second through fourth MOS transistors.

According to another aspect of the present invention, the first MOS transistor in the SWD may be a driving MOS transistor.

According to another aspect of the present invention, the second through fourth MOS transistors may share an active area.

According to another aspect of the present invention, a word line (WL) may be disposed in the predefined direction.

According to another aspect of the present invention, a source area disposed on one side of the GP of the first MOS transistor and a drain area disposed on the opposite side of the GP of the first MOS transistor.

According to another aspect of the present invention, a source area of the second MOS transistor may be shared with a source area of the third MOS transistor, and a drain area of the third MOS transistor may be shared with a drain area of the fourth MOS transistor.

According to another aspect of the present invention, second through fourth gate electrodes may be disposed in the second area, the second through fourth gate electrodes may be fabricated in each GP of the second through fourth MOS transistors, respectively, and the second MOS transistor may be structured to receive a high supply voltage through the second gate electrode, the third MOS transistor may be structured to receive a first control signal through the third gate electrode, and the fourth MOS transistor may be structured to receive a second control signal through the fourth gate electrode.

According to another aspect of the present invention, the first control signal is a signal input at a logic high level responsive to a normal word line enable (NWE) signal being input in an active state, and the second control signal is a signal input at a logic low level responsive to the NWE signal being input in an active state.

According to another aspect of the present invention, there is provided a method of forming an SWD, which may include forming a first N-type active area on a P-type semiconductor substrate; forming a second N-type active area separated a predefined distance from the first N-type active area, at one side of the first N-type active area on the P-type semiconductor substrate; forming a GP of the first MOS transistor in a predefined direction over the first N-type active area; and forming each GP of the second through fourth MOS transistors over the second N-type active area, wherein each GP of the second through fourth MOS transistors is disposed and formed in parallel to each other and perpendicular to the predefined direction of the GP of the first MOS transistor.

According to another aspect of the present invention, the first N-type active area and the GP of the first MOS transistor may form a driving MOS transistor in the SWD.

According to another aspect of the present invention, the second through fourth MOS transistors may be formed to share active areas, within the second N-type active area.

According to another aspect of the present invention, a GP of the second MOS transistor, a GP of the third MOS transistor, and a GP of the fourth MOS transistor may be formed in parallel, perpendicular to the predefined direction, separated a predefined distance from each other.

According to another aspect of the present invention, a source area of the second MOS transistor may be shared with a source area of the third MOS transistor, and the third drain area may be shared with a drain area of the fourth MOS transistor.

According to other aspects of the present invention, the method of forming the SWD may include forming a NWE signal line in a predefined direction over the first area and the second area, or forming an insulating material layer between the first and second N-type active areas and an area where GPs of the first through fourth transistor are formed. The method may also include forming an insulating material layer between the first and second N-type active areas and an area where GPs of the first through fourth transistor are formed, and forming an insulating material layer between an area where GPs of the first through fourth MOS transistors are formed and an area where the SWD signal line is formed.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The attached drawings for illustrating preferred embodiments of the present invention are referred to in order to gain a sufficient understanding of the present invention, the merits thereof, and the objectives accomplished by the implementation of the present invention.

Hereinafter, the present invention will be described in detail by explaining preferred embodiments of the invention with reference to the attached drawings. Like reference numerals in the drawings denote like elements.

Figure 1:
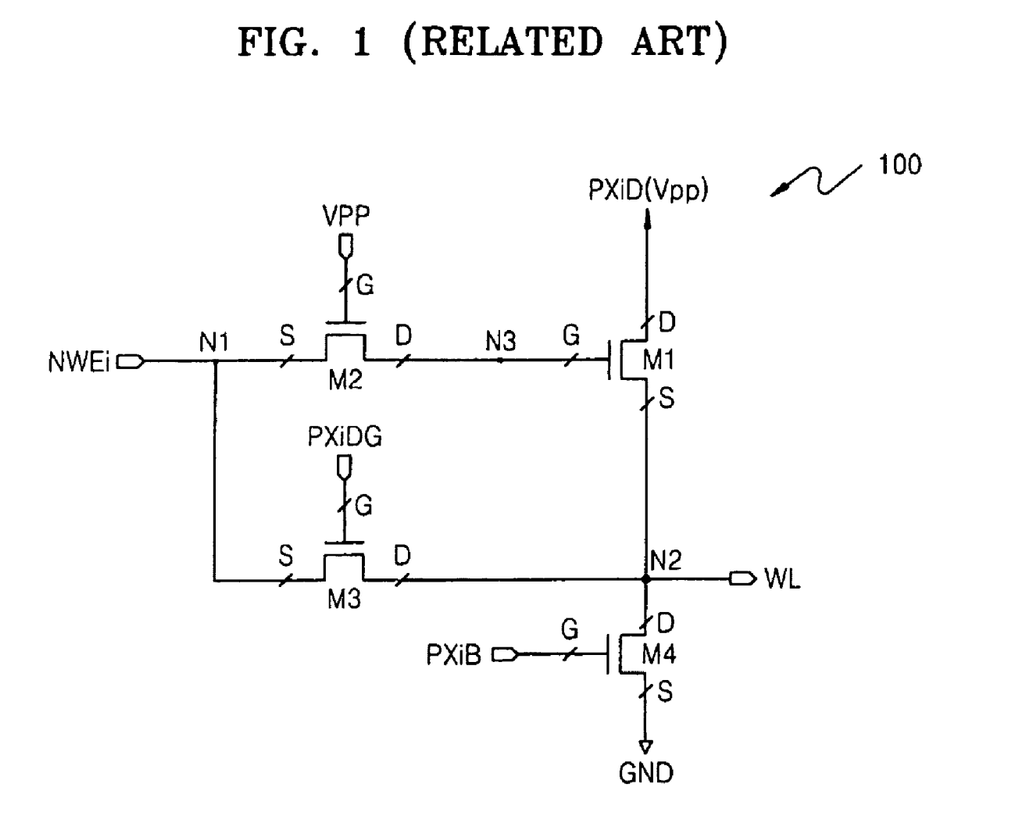
FIG. 1 is a general circuit diagram of a Sub-Word line Driver (SWD)

FIG. 1 is a general circuit diagram of an SWD 100. Referring to FIG. 1, an SWD 100 constituting 4 N-type MOS transistors is illustrated. The SWD 100 includes first through fourth N-type metal-oxide-semiconductor (MOS) transistors M1, M2, M3, and M4. The SWD 100 drives respective WLs 252 and 254 illustrated in FIG. 2 responsive to a Normal Word Line Enable (NWE) signal, a first, a third, and a fourth control signals PXiD, PXiDG, and PXiB.

The third control signal PXiDG and the fourth control signal PXiB are signals applied to gate G of the third MOS transistor M3 and the fourth MOS transistor M4, respectively. The third control signal PXiDG and the fourth control signal PXiB turn on or turn off the third and fourth transistors M3 and M4. When the NWE signal is activated and applied, the third control signal PXiDG is applied at a logic high level and the fourth control signal PXiB is applied at a logic low level. A high supply voltage Vpp is applied to a gate terminal G in the second MOS transistor M2.

The first control signal PXiD may be enabled at a high supply voltage Vpp. When the NWE signal is activated and applied, a high supply voltage Vpp is applied to a drain terminal D in the first MOS transistor M1. The first MOS transistor M1 becomes a driving transistor to drive the WL. Thus, the better a driving capability of the SWD is, the better a driving capability of the first MOS transistor M1.

Figure 2:
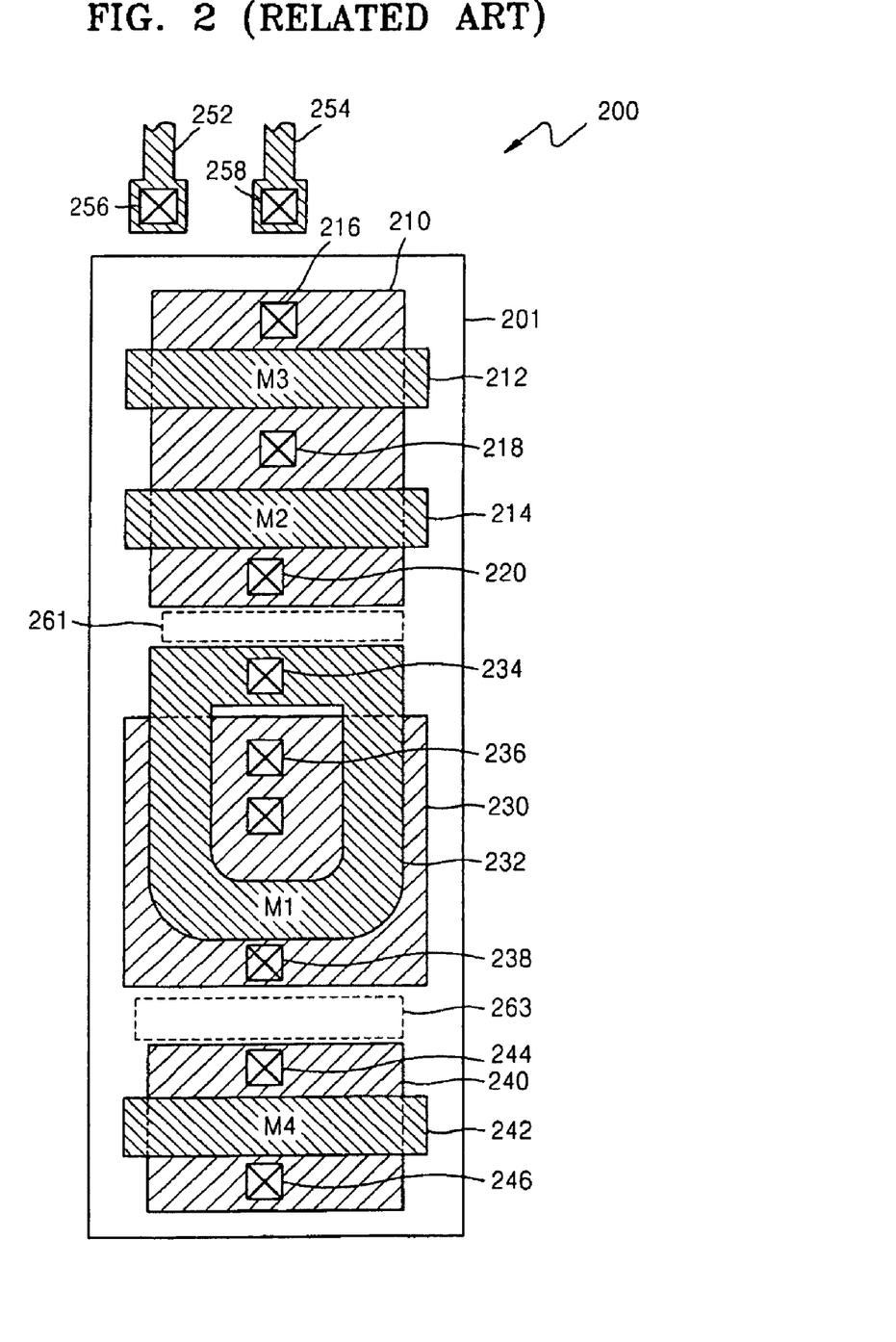
FIG. 2 is a layout structure of a conventional SWD used to improve driving capability.

FIG. 2 is a layout structure of a conventional SWD 200 used to improve a driving capability. Referring to FIG. 2, in the layout structure 200 of the conventional SWD 100, the SWD 201 includes a first area 210 including the third and second MOS transistors M3 and M2, a second area 230 including the first MOS transistor M1, and a third area 240 including the fourth MOS transistor M4. A Shallow Trench Isolation (STI) structure is included in area 261 and 263 that are disposed between the first area 210 and the second area 230, and the second area 230 and the third area 240, respectively.

In the conventional layout structure 200, a polysilicon gate, commonly called gate poly, (GP) 232 of the first MOS transistor M1, which is a driving transistor, is formed in a horse-shoe shape, in order to prevent an expansion of an area while improving a driving capability of the SWD 201. The driving capability of the driving transistor depends on the entire width of a GP. As the GP becomes wider, a charge collected in a channel formed under the gate increases. Accordingly, driving current increases, and therefore the driving capability improves. In other words, an increase of the width of the GP results in an increase in the driving capability.

The conventional layout structure 200 increases the width of a GP by disposing the GP of the driving transistor in a form of the horse-shoe shape. However, the conventional layout structure 200 having the GP disposed in the horse-shoe shape is problematic in that reliability decreases as the size of an area for a source or a drain decreases. In other words, the first MOS transistor M1 does not operate properly during accelerated life tests such as intensive writing/reading, operation at high temperature, or experimenting with high voltage. A reliability problem is caused due to a lack of area being provided for a source or a drain in the first MOS transistor M1. Also, in the driving capability, despite the fact that the width of the GP 232 of the MOS transistor M1 is large, the SWD 201 performs at 60% (a 40% decrease in driving capability) of the driving capability.

As described above, in the conventional layout structure 200, a degradation of a performance in a memory chip occurs because of a disposition of the transistor in the abnormal form such as the horse-shoe shape. In this conventional layout structure 200, the size of a chip can not be increased even though there is a degradation in performance, because the entire size of a device will, as a result, exponentially increase.

Also, in conventional layout structures, WLs 252 and 254 are vertically formed first, and GPs 212 and 214 of the second and third MOS transistors are horizontally formed by changing a direction. Then, the GP 232 of the first MOS transistor is formed by changing a direction again. After which, the GP 242 of the fourth MOS transistor M4 is horizontally formed. The MOS transistors are separated by a predefined distance from each other. Electrodes 256, 258, 216, 218, 220, 234, 236, 238, 244, and 246 may also be formed therein.

Figure 3:
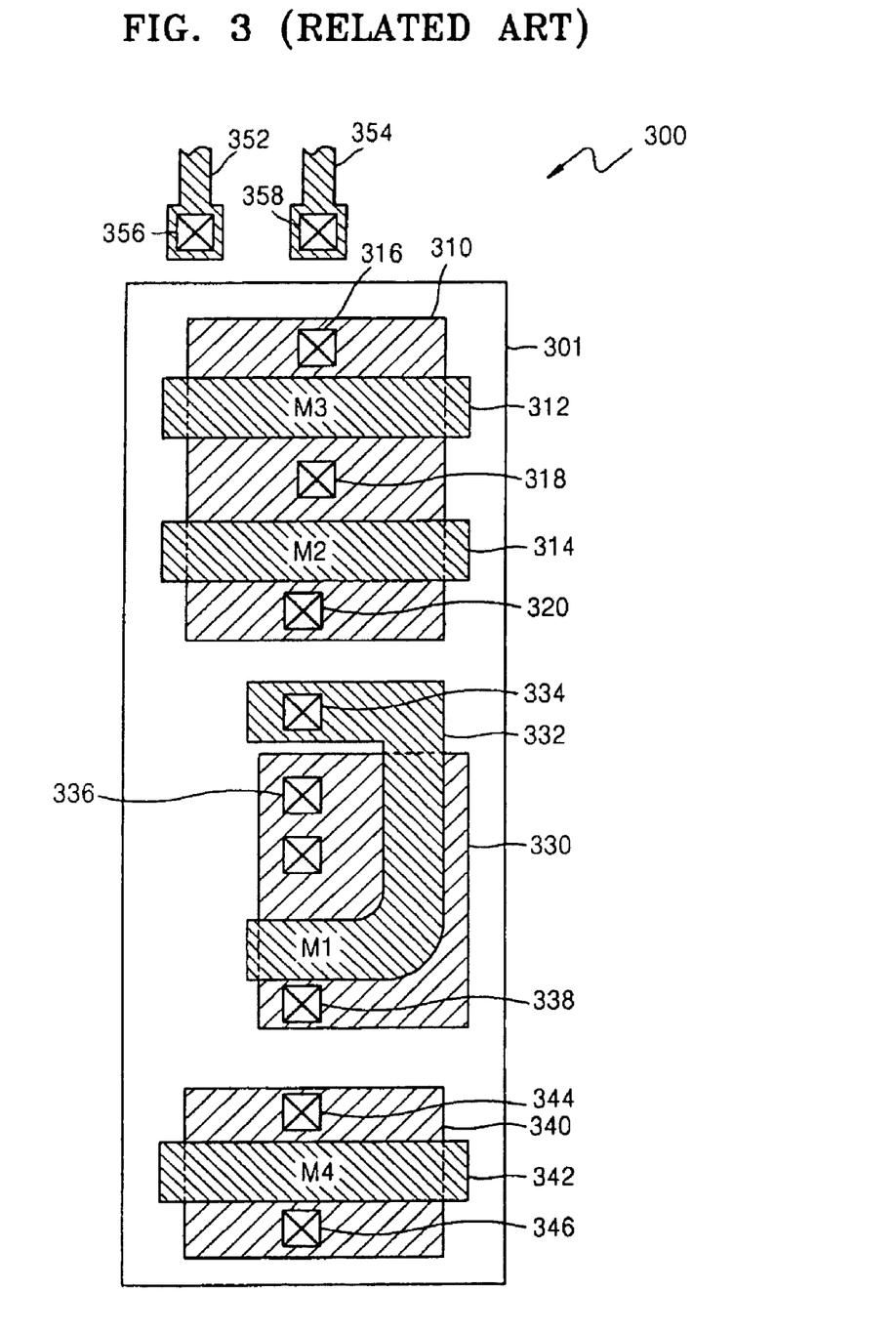
FIG. 3 is a layout structure of the conventional SWD for solving a problem of the SWD illustrated in FIG. 2.

FIG. 3 is a layout structure 300 of another conventional SWD 301 for solving the problem of the SWD 201 illustrated in FIG. 2. The layout structure 300 illustrated in FIG. 3 is for solving the reliability problem that occurs in the layout structure 200 illustrated in FIG. 2, without increasing the size of a chip.

Referring to FIG. 3, the layout structure 300 uses a GP 332 in a shape where the horse-shoe shaped GP 232 illustrated in FIG. 2 is cut in half. The rest of the layout structure, including reference numerals 352, 354, 356, 358, 316, 310, 312, 318, 314, 320, 334, 336, 330, 338, 344, 340, 342, and 346 substantially correspond to the structure disclosed in the description of FIG. 2, and therefore a detailed explanation thereof will be omitted.

In the conventional layout structure 300, the width of the GP 332 is reduced by a half, compared to the layout structure 200 illustrated in FIG. 2. Accordingly, a driving capability of a WL is decreased, and therefore the performance of a chip is significantly decreased. In other words, although the reliability problem in the conventional layout structure 200 having the abnormal horse-shoe shaped GP was solved by reducing the width of the GP in the conventional layout structure 300, the layout structure 300 is still problematic in that the driving capability is decreased.

Also, as previously mentioned, in conventional layout structures (for example, the layout structure 200 illustrated in FIG. 2), WLs 252 and 254 are vertically formed first, and GPs 212 and 214 of the second and third MOS transistors are horizontally formed by changing a direction. Then, the GP 232 of the first MOS transistor is formed by changing a direction again. After which, the GP 242 of the fourth MOS transistor M4 is horizontally formed. The MOS transistors are separated a predefined distance from each other. In other words, more time and costs are required for layout and lithography processes, because processing directions have to be continuously changed without a consistency of the processing direction.

Figure 4A:
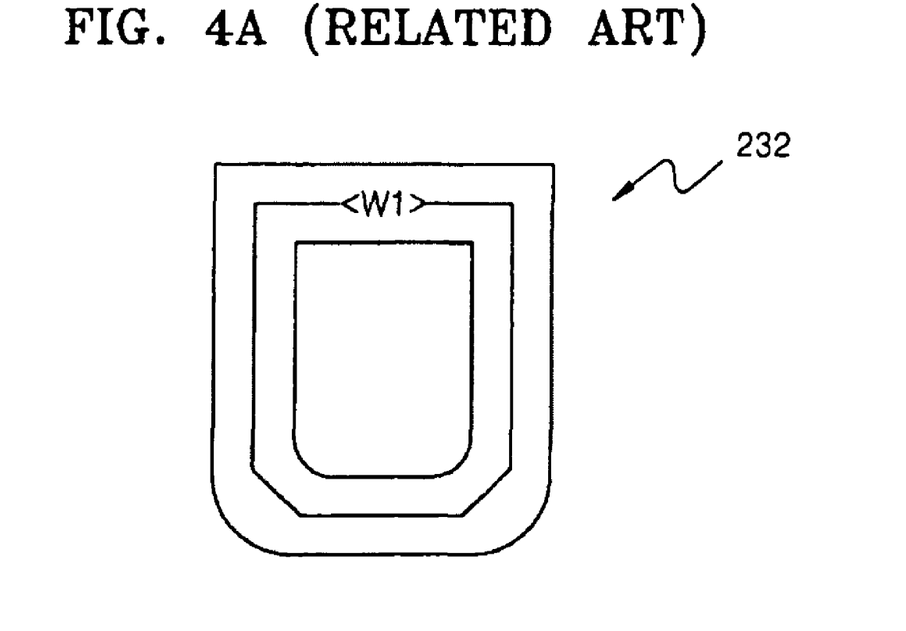
FIG. 4A illustrates a gate-poly (GP) of a driving transistor used in the SWD illustrated in FIG. 2.

FIG. 4A illustrates a GP of the driving transistor used in the SWD 201 illustrated in FIG. 2. Referring to FIG. 4A, in the layout structure 200 illustrated in FIG. 2, the GP 232 of the first MOS transistor M1, which is a driving transistor, is formed in the horse-shoe shape. Accordingly, a width has a width value W1 illustrated in FIG. 4A, and may have a larger value. However, the layout structure 200 is problematic in that reliability is decreased.

Figure 4B:
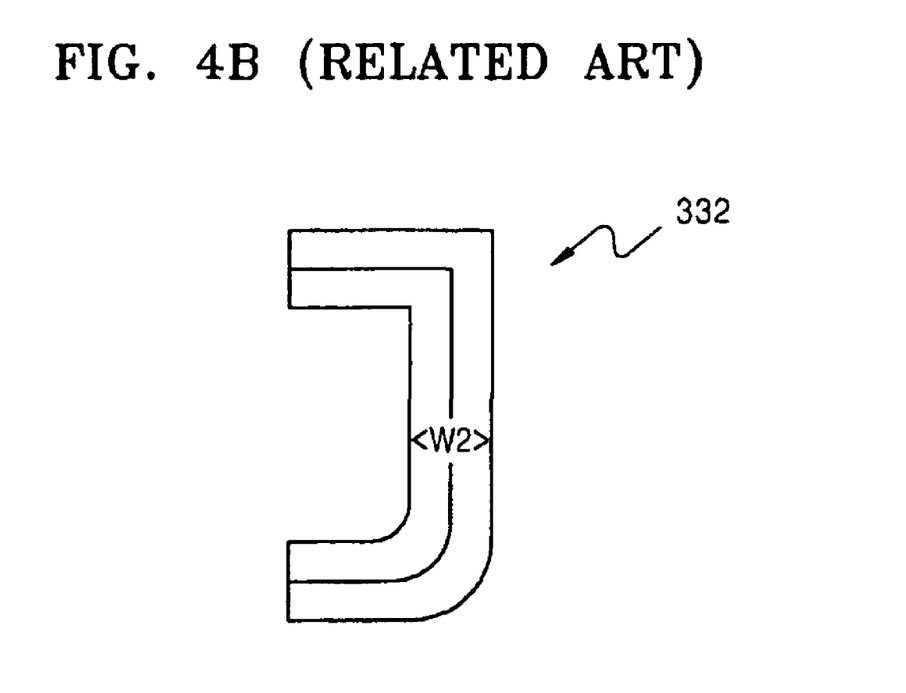
FIG. 4B illustrates a GP of a driving transistor used in the SWD illustrated in FIG. 3.

FIG. 4B illustrates the GP 332 of the driving transistor used in the SWD 301 illustrated in FIG. 3. Referring to FIG. 4B, the GP 332 of the first MOS transistor M1 in the layout structure 300 illustrated in FIG. 3 is formed in a shape of a "J" in order to solve the problem that occurs in the layout structure 200 illustrated in FIG. 2. Accordingly, the width W2 is smaller than the width W1. Thus, the layout structure 300 illustrated in FIG. 3 is problematic in that a decrease in driving capability occurs.

As described above, the conventional layout structures cannot achieve objectives such as improvements in reliability or prevention of area expansion. Therefore, it is necessary to provide a layout structure of the SWD for improving reliability as well as preventing area expansion.

Figure 5A:
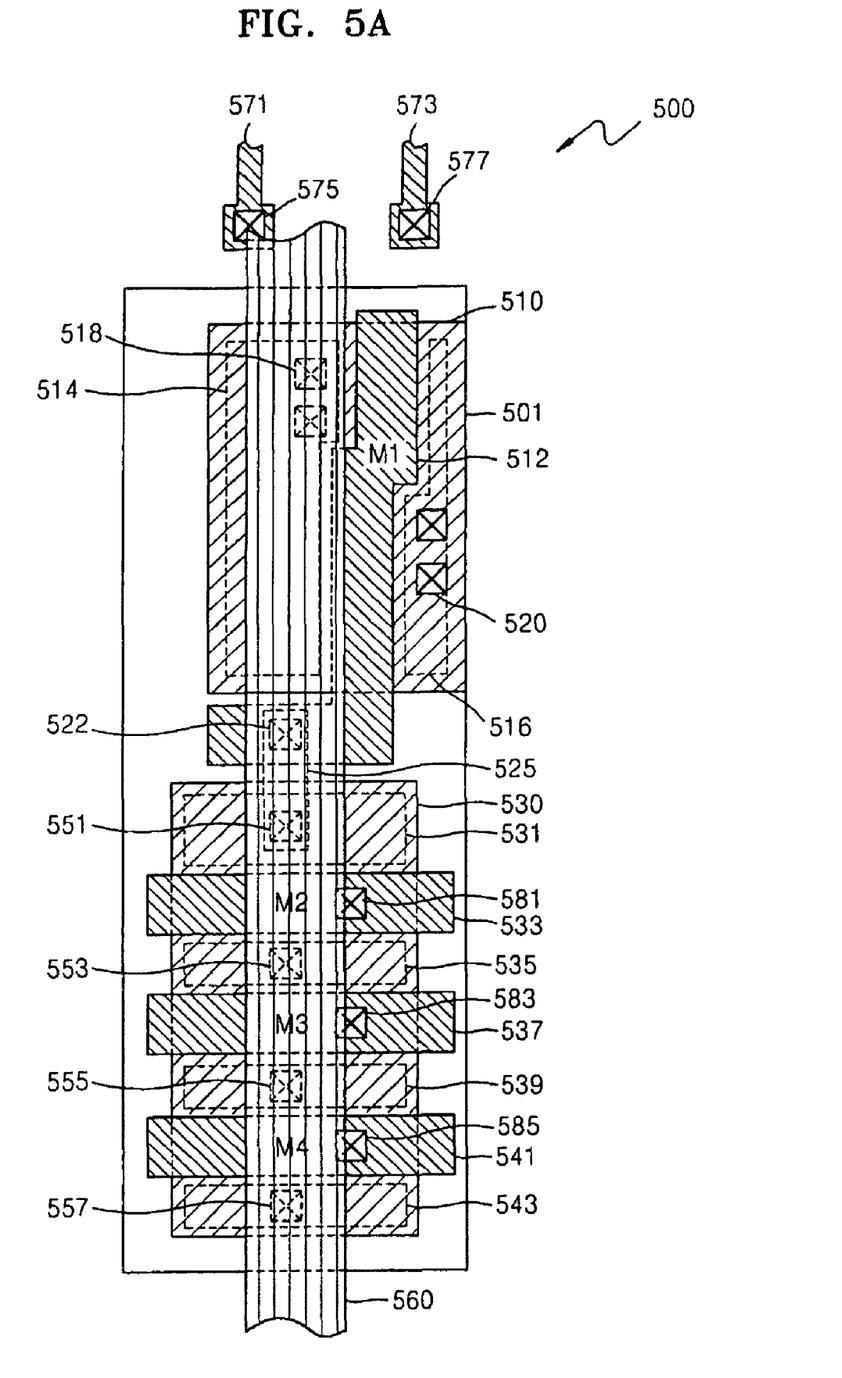
FIG. 5A is a layout structure of an SWD according to an embodiment of the present invention.

FIG. 5A is a layout structure 500 of a Sub-Word line Driver (SWD) 501 according to an embodiment of the present invention. FIG. 5A is a layout structure of a circuit in the SWD 100 illustrated in FIG. 1.

Referring to FIG. 5A, the layout structure 500 of the SWD 501 includes a first area 510 and a second area 530. The first area 510 includes a first metal-oxide-semiconductor (MOS) transistor M1 and a first N-type active area (N-active). A gate-poly (GP) 512 of the first MOS transistor M1 is vertically (i.e., lengthwise) disposed and the GP 512 neighbors a source or drain area 514 or 516 on each side.

Electrodes 518 and 520, which can apply voltages, are formed in each source or drain area 514 or 516. Here, when a source voltage is applied to the electrode 518, the area 514 becomes a source area, and when a drain voltage is applied to the electrode 518, the area 516 becomes a drain area. The source and drain areas can be switched by switching applied voltages.

Explanations will be given assuming that the first MOS transistor M1 coupled to a second node N2 is a source area, and an area 516 is a drain area of the first MOS transistor. Accordingly, the electrode 518 may be coupled to a wordline (WL) 571 or 573 via electrodes 575 or 577 and a metal line (not shown). Also, a first control signal PXiD may be applied to the electrode 520. The first control signal PXiD is an enabled applied signal when a Normal Wordline Enable (NWE) signal is enabled and input. A level of the enabled applied signal may become that of a high supply voltage Vpp.

The second area 530 may include second through fourth MOS transistors M2, M3, and M4. Also, the second area 530 may include a second N-type active area (N-active). Here, the second through fourth MOS transistors M2, M3, and M4 share active areas. In other words, the second through fourth MOS transistors M2, M3, and M4 use the second N-active of the second area 530.

In the second area 530, the second MOS transistor M2, the third MOS transistor M3, and the fourth MOS transistor M4 are sequentially included. First, a GP 533 of the second MOS transistor M2 may be disposed horizontally (i.e., widthwise), and a GP 537 of the third MOS transistor M3 may be disposed in parallel to the GP 533 of the second transistor M2, and separated a predefined distance from the GP 533. Also, a GP 541 of the fourth MOS transistor M4 may be disposed in parallel, and separated a predefined distance from the GP 537 of the third MOS transistor M3.

The GP 533 of the second MOS transistor M2 may be adjacent to a drain area 531 and a source area 535 on each side. As in the circuit illustrated in FIG. 1, a gate G of the first MOS transistor M1 is coupled to a drain D of the second MOS transistor M2. Accordingly, a gate electrode 522 of the first MOS transistor M1 and a drain electrode 551 of the second MOS transistor M2 may be coupled by a metal line 525. In the GP 533, a gate electrode 581 may be disposed, which may receive a high supply voltage Vpp.

The GP 537 of the third MOS transistor M3 may be adjacent to the source area 535 and a drain area 539 on each side. In the GP 537, a gate electrode 583 may be disposed, which may receive a third control signal PXiDG. In the drain area 539, a drain electrode 555 may be disposed.

The GP 541 of the fourth MOS transistor M4 may be adjacent to the drain area 539 and a source area 543 on each side. In the GP 541, a gate electrode 585 may be disposed, which receives a fourth control signal PXiB. In the source area 543, a source electrode 557 may be disposed, which may be coupled to ground.

As explained above, the source area of the second MOS transistor M2 and the source area of the third MOS transistor M3 may share an active area 535. Also, the drain area of the third MOS transistor M3 and the drain area of the fourth MOS transistor M4 may share an active area 539. Here, the third control signal PXiDG may be a signal applied at a logic high level when the NWE signal is activated and applied to the SWD. Also, the fourth control signal PXiB may be a signal applied at a logic low level when the NWE signal is activated and applied to the SWD 501.

A metal line 560 where the NWE signal is transmitted can be formed vertically (i.e., lengthwise) throughout substantially the entire layout structure 500 of the SWD 501. The NWE signal line 560 may be coupled to an electrode 553 formed in the source area 535 of the second MOS transistor M2. Here, the electrode 553 formed in the source area 535 of the second MOS transistor M2 and the NWE signal line 560 are coupled by direct contact using a via, which is well known in the art. Also, the metal line and a gate electrode, a source electrode, or a drain electrode can be coupled by direct contact, which are well known in the art, and therefore a detailed explanation thereof will be omitted.

The active area is an area doped with N-type impurities, where a GP is included on the top. Here, Inter Metal Dielectrics (IMD), which is an insulating material between layers, is included between the active area and the GP. The IMD is included between the metal line (for example, the NWE signal line 560), which is included in the GP, and the top of the GP. Having such IMD is well known in the art.

Figure 5B:
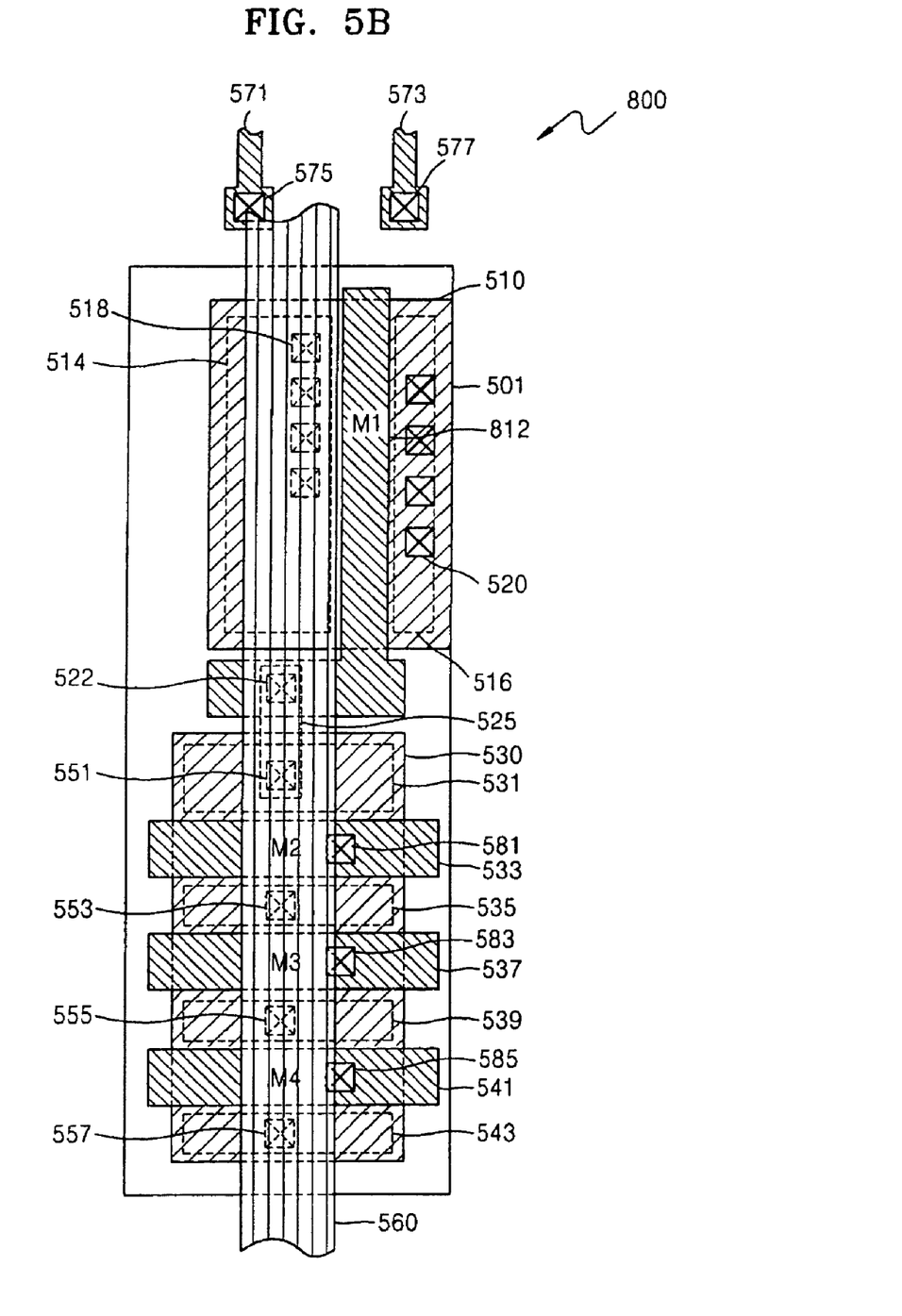
FIG. 5B is a layout structure of the SWD in which a GP of a first MOS transistor illustrated in FIG. 5A is transformed.

FIG. 5B is a layout structure 800 of the SWD 501 in which a GP of a first MOS transistor M1 illustrated in FIG. 5A is transformed. Referring to FIG. 5B, a GP 812 of the first MOS transistor M1 can be disposed in the form of a reversed asymmetric "T" structure so that a first portion of the GP 812 can be projected along the vertical (i.e., lengthwise) direction in a substantially straight line and a second portion of the GP 812 can be projected along the horizontal (i.e., widthwise) direction with both ends of the second portion extending perpendicular to the first portion, thereby forming the reversed asymmetric "T" structure. More electrodes 518 and 520 formed in the source or drain area 514 or 516 can be included, compared to the structure illustrated in FIG. 5A, since the first portion of the GP 812 is disposed in a substantially straight line.

Figure 5C:
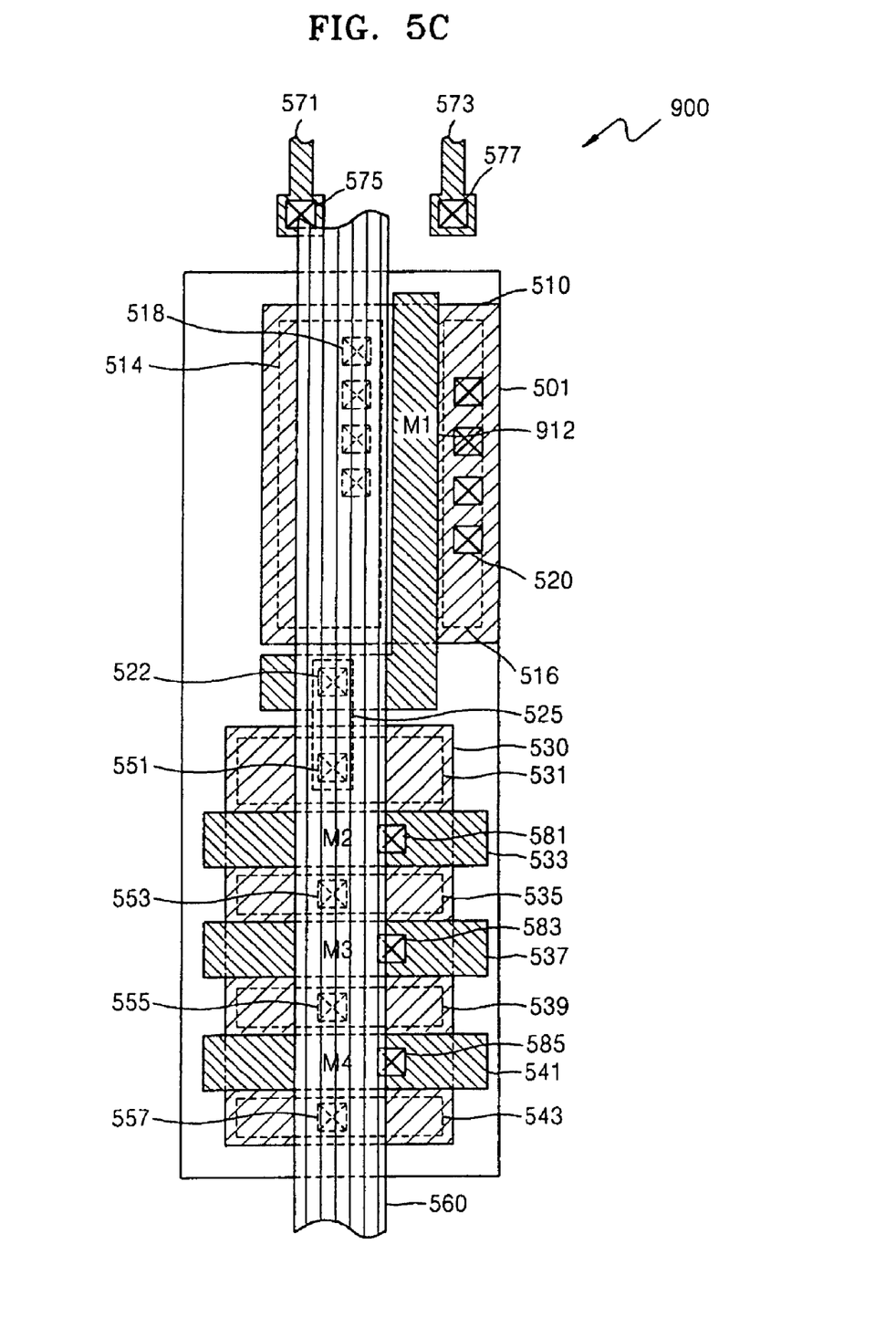
FIG. 5C is another layout structure of the SWD in which the GP of the first MOS transistor illustrated in FIG. 5A is transformed.

FIG. 5C is another layout structure 900 of the SWD 501 in which the GP of the first MOS transistor illustrated in FIG. 5A is transformed. Referring to FIG. 5C, unlike the GP 812 illustrated in FIG. 5B, a bottom portion of the GP 912 of the first MOS transistor M1 does not include both ends extending perpendicular to the vertical (lengthwise) portion of the GP 912. In other words, a first portion of the GP 912 of the first MOS transistor M1 can be a projected along the vertical (i.e., lengthwise) direction in a substantially straight line and a second portion of the GP 912 can be projected along the horizontal (i.e., widthwise) direction with only one end of the second portion extending perpendicular to the first portion, thereby forming an "L" shape. More electrodes 518 and 520 formed in the source or drain area 514 or 516 can be included, compared to the structure illustrated in FIG. 5A, since the GP 912 is disposed in the form of a substantially straight line.

As described above with reference to FIGS. 5A through 5C, the layout structure of the SWD according to the present invention increases a width by vertically (i.e., lengthwise) disposing a GP of a driving transistor M1. Accordingly, the driving capability is improved.

In the aforementioned layout structures, a source area of a second MOS transistor M2 and a source area of a third MOS transistor may share an active area 535. A drain area of a third MOS transistor M4 and a drain area of a fourth transistor M4 may share an active area 539. By sharing such active areas, a layout structure 500 according to embodiments of the present invention reduces layout areas of the second through fourth transistors M2, M3, and M4. Accordingly, despite increasing layout areas of the first MOS transistor M1, which is a driving transistor, the area of a layout structure 500 of the entire SWD is not increased.

As illustrated in FIGS. 5A through 5C, a layout structure of the SWD according to the present invention increases a width by disposing a GP of the driving transistor M1 so as to be structured vertically (i.e., lengthwise), while reducing layout areas of the second through fourth transistors M2, M3, and M4. Accordingly, a driving capability of the SWD is improved without increasing an area.

Also, as illustrated in FIG. 5A, the WL and the first MOS transistor M1 are vertically formed. Then, a processing direction is changed once to form the second through fourth MOS transistors M2, M3, and M4 perpendicular to the WL and the first MOS transistor M1. Accordingly, the processing direction is only changed once in manufacturing, which simplifies the process and reduces processing time and cost.

Figure 6:
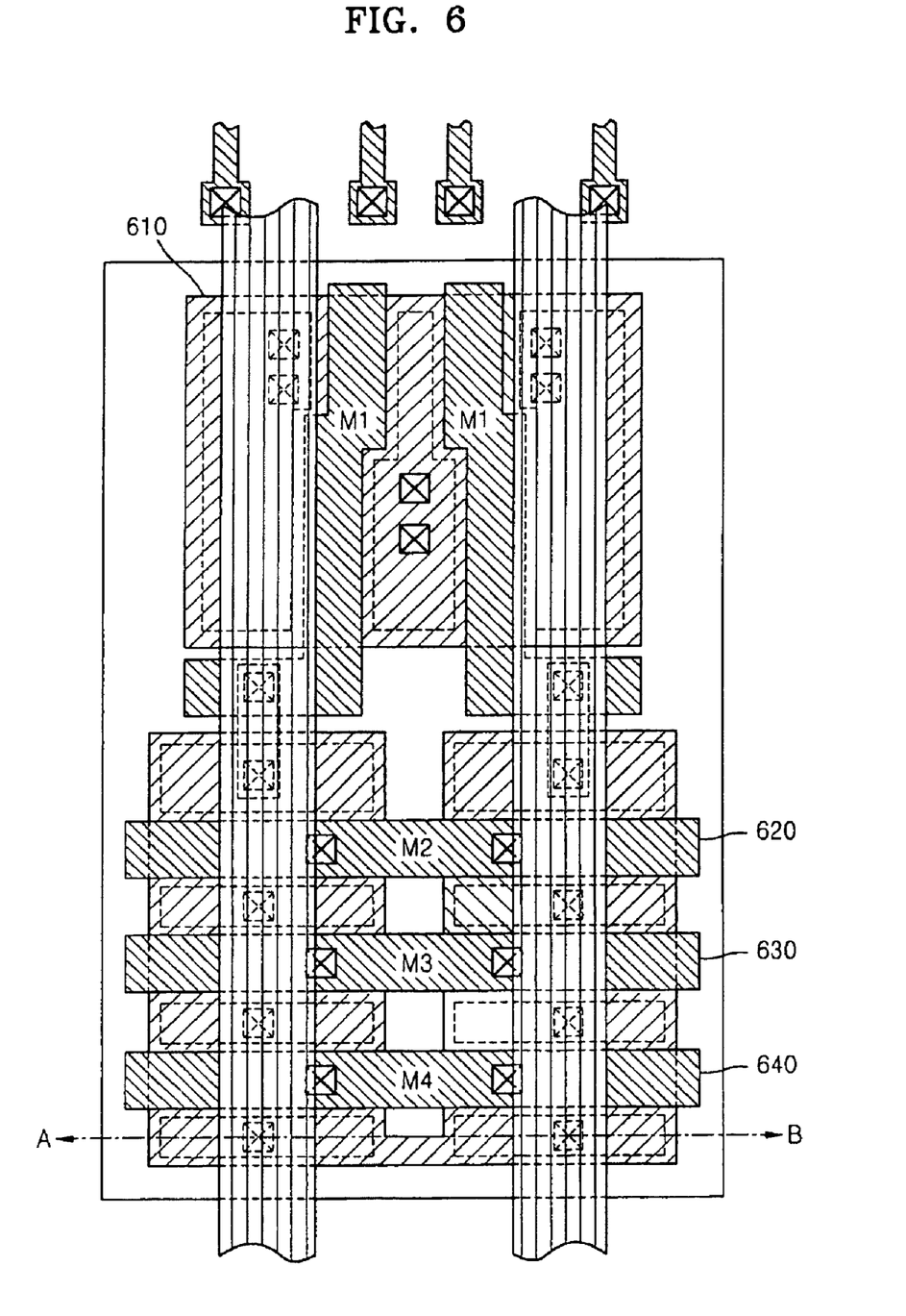
FIG. 6 illustrates a case where two SWDs, as illustrated in FIG. 5A, are disposed.

FIG. 6 illustrates a case where two SWDs, as illustrated in FIG. 5A, are disposed. Referring to FIG. 6, two layout structures of the SWD illustrated in FIG. 5A can be symmetrically disposed. As illustrated in FIG. 6, two SWDs may be disposed in a first N-type active area 610. Also, GPs 620, 630, or 640 may be shared among second through fourth MOS transistors M2, M3, and M4, respectively. The second through fourth MOS transistors may be structured to include at least two different N-type active areas.

In addition, one or more structures substantially identical to the one illustrated in FIG. 6 can further be included symmetrically to a horizontal line <A-B>. In other words, four or more SWDs can be disposed together.

Figure 7:
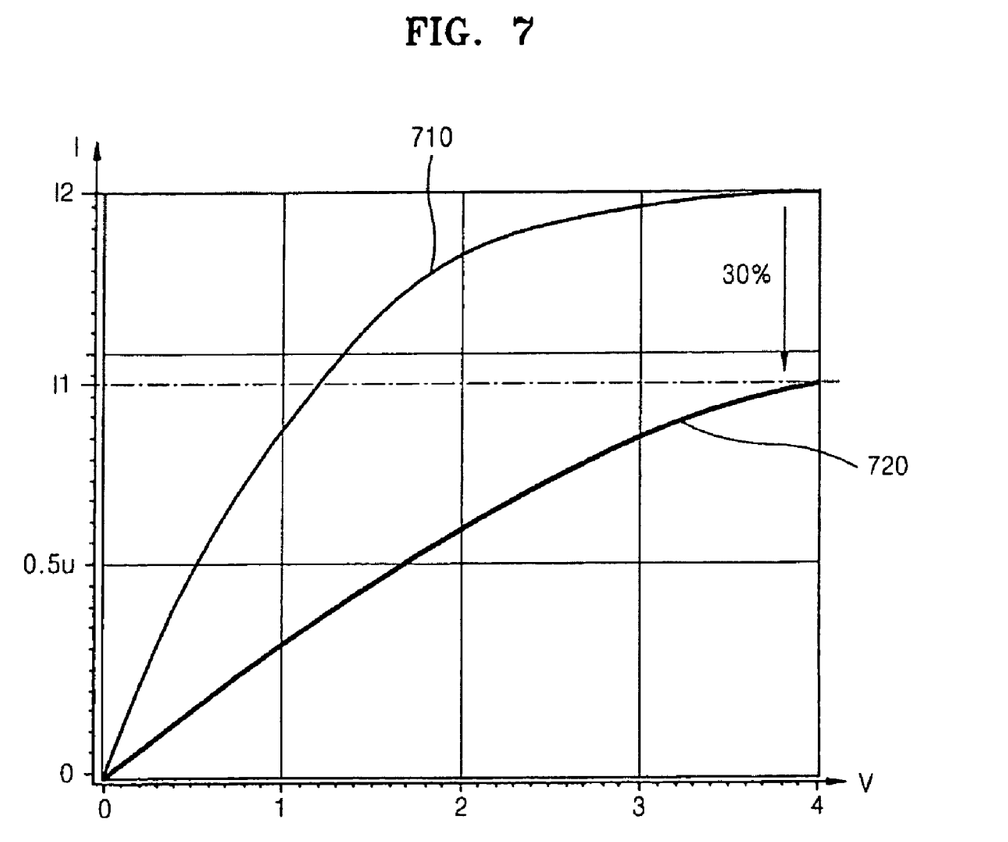
FIG. 7 is a graph respectively illustrating driving capabilities of the conventional SWD and the SWD according to an embodiment of the present invention.

FIG. 7 is a graph respectively illustrating driving capabilities of the conventional SWD and the SWD according to an embodiment of the present invention. The driving capability is a capability of quickly outputting a large voltage when a voltage larger than a predefined voltage is applied to a gate. The larger the output voltage is, the more accurate the selection of a WL can be made.

Referring to FIG. 7, a curve 720 illustrates a current output to a WL in the layout structure 300 illustrated in FIG. 3. A curve 710 illustrates a current output to a WL in the layout structure 500 illustrated in FIG. 5A. When the same current is supplied to a gate of a driving transistor M1, a driving current is saturated at a current value "I2" in the layout structure 500 according to the present invention, whereas a driving current is saturated at a current value "I1" in the conventional layout structure 300.

As illustrated in FIG. 7, when the same voltage is applied to a gate of a first MOS transistor M1, about 30% percent decreased voltage is output from the conventional layout structure 300, compared to the layout structure 500 according to the present invention. In other words, in the layout structure 500 according to the present invention, it is possible to significantly improve a driving capacity, compared to the conventional layout structure.

A layout method of an SWD according to the present invention has the same technical spirit and scope as those of the aforementioned layout structure so that those of ordinary skill in the art will understand the layout method of an SWD from the above explanation.

As described above, the layout structure and layout method of an SWD can improve a driving capability without increasing an area, by vertically (i.e., lengthwise) disposing a GP of a driving transistor and perpendicularly disposing the rest of transistors at one side of the GP.

Also, it is possible to reduce processing time and cost by reducing the number of times a direction is changed during a manufacturing process.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A layout structure of a Sub-Word line Driver (SWD) including first through fourth metal-oxide-semiconductor (MOS) transistors, the layout structure comprising:

a first area including an active area of the first MOS transistor, wherein a gate-poly (GP) of the first MOS transistor is disposed in a predefined direction over a portion of the first area; and a second area including an active area of the second through fourth MOS transistors, wherein each GP of the second through fourth MOS transistors is disposed over different portions of the second area, each GP of the second through fourth MOS transistors being disposed in parallel to each other, the second area being substantially adjacent to the first area, wherein the GP of the first MOS transistor disposed in the predefined direction is substantially perpendicular to each GP of the second through fourth MOS transistors.

2. The layout structure of claim 1, wherein the first MOS transistor in the SWD is a driving MOS transistor.

3. The layout structure of claim 2, wherein the second through fourth MOS transistors share the active area.

4. The layout structure of claim 3, wherein a word line (WL) is disposed in the predefined direction.

5. The layout structure of claim 3, wherein the first area comprises:

a source area disposed on one side of the GP of the first MOS transistor and a drain area disposed on the opposite side of the GP of the first MOS transistor.

6. The layout structure of claim 3, wherein the GPs of the second through fourth MOS transistors are separated a predefined distance from each other.

7. The layout structure of claim 6, wherein a source area of the second MOS transistor is shared with a source area of the third MOS transistor, and wherein a drain area of the third MOS transistor is shared with a drain area of the fourth MOS transistor.

8. The layout structure of claim 7, wherein the GP of the first MOS transistor and the drain area of the second MOS transistor are electrically coupled using a first gate electrode and a metal line.

9. The layout structure of claim 7, further comprising:

second through fourth gate electrodes disposed in the second area, wherein the second through fourth gate electrodes are fabricated in each GP of the second through fourth MOS transistors, respectively.

10. The layout structure of claim 9, wherein the second MOS transistor is structured to receive a high supply voltage through the second gate electrode, the third MOS transistor is structured to receive a first control signal through the third gate electrode, and the fourth MOS transistor is structured to receive a second control signal through the fourth gate electrode.

11. The layout structure of claim 10, wherein the first control signal is a signal input at a logic high level responsive to a normal word line enable (NWE) signal being input in an active state.

12. The layout structure of claim 9, wherein the second control signal is a signal input at a logic low level responsive to the NWE signal being input in the active state.

13. The layout structure of claim 3, wherein the layout structure further comprises a NWE signal line disposed in the predefined direction extending substantially over the first area and the second area.

14. The layout structure of claim 7, wherein the layout structure further comprises a NWE signal line disposed in the predefined direction extending substantially over the first area and the second area, and wherein the NWE signal line is electrically coupled to a shared active area included in-between a GP of the second MOS transistor and a GP of the third MOS transistor.

15. The layout structure of claim 1, wherein the first through fourth MOS transistors are N-type MOS transistors, and wherein the active areas included in the first area and the second area are N+ doped N-type active areas.

16. A layout structure of a Sub-Word line Driver (SWD) including first through fourth metal-oxide-semiconductor (MOS) transistors, the layout structure comprising:

a gate of the first MOS transistor structured to have substantially an L shape, a lengthwise portion of the L shaped gate being disposed in a predefined direction; and gates of the second through fourth MOS transistors disposed in parallel to each other, at least one of the gates of the second through forth MOS transistors being substantially adjacent to a widthwise portion of the L shaped gate of the first MOS transistor, wherein the lengthwise portion of the L shaped gate of the first MOS transistor disposed in the predefined direction is substantially perpendicular to each gate of the second through fourth MOS transistors.

17. A layout structure of a Sub-Word line Driver (SWD), comprising:

a first active area including at least two symmetrically disposed metal-oxide-semiconductor (MOS) transistors, the at least two symmetrically disposed MOS transistors being used as driving transistors, wherein gates of the at least two symmetrically disposed driving MOS transistors are disposed in a predefined direction; and second and third active areas respectively including at least three MOS transistors, wherein a gate of the at least three MOS transistors is disposed in parallel to each other, the second and third active areas being substantially adjacent to the first active area, wherein the gates of the at least two symmetrically disposed driving MOS transistors are substantially perpendicular to each gate of the at least three MOS transistors.

18. The layout structure of claim 17, wherein the layout structure further comprises at least two NWE signal lines disposed in the predefined direction, one of the NWE signal lines extending substantially over the first and second active areas, the other of the NWE signal lines extending substantially over the first and third active areas.

19. The layout structure of claim 17, wherein the first through third active areas are N+ doped N-type active areas.

20. The layout structure of claim 17, wherein the gate of one of the at least two symmetrically disposed driving MOS transistors is electrically coupled to a drain region within the second active area, and wherein the gate of another of the at least two symmetrically disposed driving MOS transistors is electrically coupled to a drain region of the third active area.

* * * * *